(12) United States Patent
Cote et al.

(10) Patent No.: US 9,213,060 B2
(45) Date of Patent: Dec. 15, 2015

(54) PROBE-ABLE VOLTAGE CONTRAST TEST STRUCTURES

(75) Inventors: William J. Cote, Hopewell Junction, NY (US); Yi Feng, Hopewell Junction, NY (US); Oliver D. Patterson, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 608 days.

(21) Appl. No.: 13/593,961

(22) Filed: Aug. 24, 2012

(65) Prior Publication Data

US 2012/0319715 A1 Dec. 20, 2012

Related U.S. Application Data

(62) Division of application No. 12/539,732, filed on Aug. 12, 2009, now Pat. No. 8,350,583.

(51) Int. Cl.
*G01R 31/20* (2006.01)
*G01R 31/28* (2006.01)

(52) U.S. Cl.
CPC ................... *G01R 31/2884* (2013.01)

(58) Field of Classification Search
CPC .. G01R 31/2853; G01R 19/145; G01R 27/16; G01R 31/026; G01R 31/2621
See application file for complete search history.

(56) References Cited

U.S. PATENT DOCUMENTS

| 4,565,966 A | 1/1986 | Burr et al. |
| 5,189,306 A | 2/1993 | Frei |
| 5,266,901 A | 11/1993 | Woo |
| 5,539,306 A | 7/1996 | Riggio, Jr. |
| 6,297,644 B1 | 10/2001 | Jarvis et al. |
| 6,452,412 B1 | 9/2002 | Jarvis et al. |

(Continued)

FOREIGN PATENT DOCUMENTS

| JP | 2004184257 A | 7/2004 |
| JP | 2005210146 A | 8/2005 |

OTHER PUBLICATIONS

J.C. Lee, C.H. Chen, D. Su, J.H. Chuang, "Investigation of Sensitivity Improvement on Passive Voltage Contrast for Defect Isolation", Microelectronics Reliability, vol. 42, No. 9-11, pp. 1707-1710, 2002.

(Continued)

*Primary Examiner* — Tung X Nguyen
(74) *Attorney, Agent, or Firm* — Cantor Colburn LLP; Steven Meyers

(57) ABSTRACT

Test structures and method for detecting defects using the same. A probe-able voltage contrast (VC) comb test structure that includes first, second and third probe pads, a comb-like structure including grounded tines, floating tines between the grounded tines, switching devices coupled with an end portion of each floating tine, and connecting the floating tines to the second probe pad, and the third probe pad being a control pad which controls the switching devices. A probe-able VC serpentine test structure that includes first, second, third and fourth probe pads, a comb-like structure including grounded tines, floating tines between the grounded tines and each floating tine connected together between the second and third probe pads, switching devices connected to an end portion of each floating tine and connecting the floating tines to the second and third probe pads, and the fourth probe pad being a control pad which controls the switching devices.

6 Claims, 7 Drawing Sheets

(56) References Cited

U.S. PATENT DOCUMENTS

| | | |
|---|---|---|
| 6,509,197 B1 | 1/2003 | Satya et al. |
| 6,544,802 B1 | 4/2003 | Jun et al. |
| 6,815,959 B2 | 11/2004 | Johnson et al. |
| 6,861,666 B1 | 3/2005 | Weiner et al. |
| 6,921,672 B2 | 7/2005 | Satya et al. |
| 7,026,175 B2 | 4/2006 | Li et al. |
| 7,081,758 B2 | 7/2006 | Umemura et al. |
| 7,340,703 B2 | 3/2008 | Hegazy et al. |
| 7,456,636 B2 | 11/2008 | Patterson et al. |
| 7,474,107 B2 | 1/2009 | Patterson et al. |
| 7,518,190 B2 | 4/2009 | Cote et al. |
| 7,592,827 B1 * | 9/2009 | Brozek .................... 324/762.01 |
| 7,683,644 B2 | 3/2010 | Filippi et al. |
| 7,733,109 B2 | 6/2010 | Ahsan et al. |
| 7,795,879 B2 | 9/2010 | Watanabe |
| 7,927,895 B1 | 4/2011 | Lavoie et al. |
| 8,039,837 B2 | 10/2011 | Patterson et al. |
| 2002/0117696 A1 | 8/2002 | Hirai et al. |
| 2003/0096436 A1 | 5/2003 | Satya et al. |
| 2005/0082664 A1 * | 4/2005 | Funaba et al. ................. 257/724 |
| 2006/0192904 A1 | 8/2006 | Almogy et al. |
| 2008/0032429 A1 | 2/2008 | Chen et al. |
| 2008/0100831 A1 | 5/2008 | Patterson et al. |
| 2008/0217612 A1 | 9/2008 | Patterson et al. |
| 2008/0237586 A1 | 10/2008 | Sun et al. |
| 2009/0057644 A1 | 3/2009 | Shin et al. |
| 2009/0096461 A1 | 4/2009 | Ahsan et al. |
| 2010/0279436 A1 | 11/2010 | Fu et al. |
| 2012/0187400 A1 | 7/2012 | Mo et al. |

OTHER PUBLICATIONS

M. Matsui, T. Odaka, H. Nagaishi, K. Sakurai, "Quantitative Measurement of Voltage contrast in SEM Images for In-Line Resistance Inspection of Wafers Manufactured for SRAM", Proceedings of the SPIE—The International Society for Optical Engineering, vol. 7272, pp. 72721D (8 pages), 2009.

M. Matsui, Z. Cheng, M. Nozoe, K. Torli, "Detecting Defects in Cu Metallization Structures by Electron-Beam Wafer Inspection", Journal of the Eletrochemical Society, vol. 151, No. 6, pp. G440-G442, 2004.

M. Javed et al., "RLC Circuit Response and Analysis (Using State Space Method)," IJCSNS International Journal of Computer Science and Network Security; vol. 8, No. 4, pp. 48-54, Apr. 2008.

EE Times, [online]; [retrieved on Oct. 18, 2011]; retrieved from the Internet http://eetimes.com/design/communications-design/4017914/Accurate-Modeling-of-Spiral-Inductors-on-Silicon-for-Wireless-RFIC-Designs Jan Van Hese, "Accurate Modeling of Spiral Inductors on Silicon for Wireless RFIC Designs," EE Times-Design; pp. 1-9; 2001.

U.S. Appl. No. 12/539,732; Non-Final Office Action; Date Filed: Aug. 12, 2009; Date Mailed: May 14, 2012; pp. 1-12.

Zhao et al.,"Fault-Coverage Analysis Techniques of Crosstalk in Chip Interconnects," IEEE Transactions on Computer-Aided Design of Integrated Circuits and Systems; vol. 22, No. 6, pp. 770-782, Jun. 2003.

O.D. Patterson, H. Wildman, D. Gal, K. Wu, "Detection of Resistive Shorts and Opens Using Voltage Contrast Inspection", Micro, vol. 24, No. 5, pp. 67-68, 2006.

T. Sakai, N. Oda, T. Yokoyama, H. Kikuchi, H. Kitajima, "Defect Isolation and Characterization in Contact Array/Chain Structures by Using Voltage Contrast Effect", Conference Proceedings of IEEE International Symposium on Semiconductor Manufacturing Conference, Santa Clara, CA, Oct. 11-13, 1999., pp. 195-198.

* cited by examiner

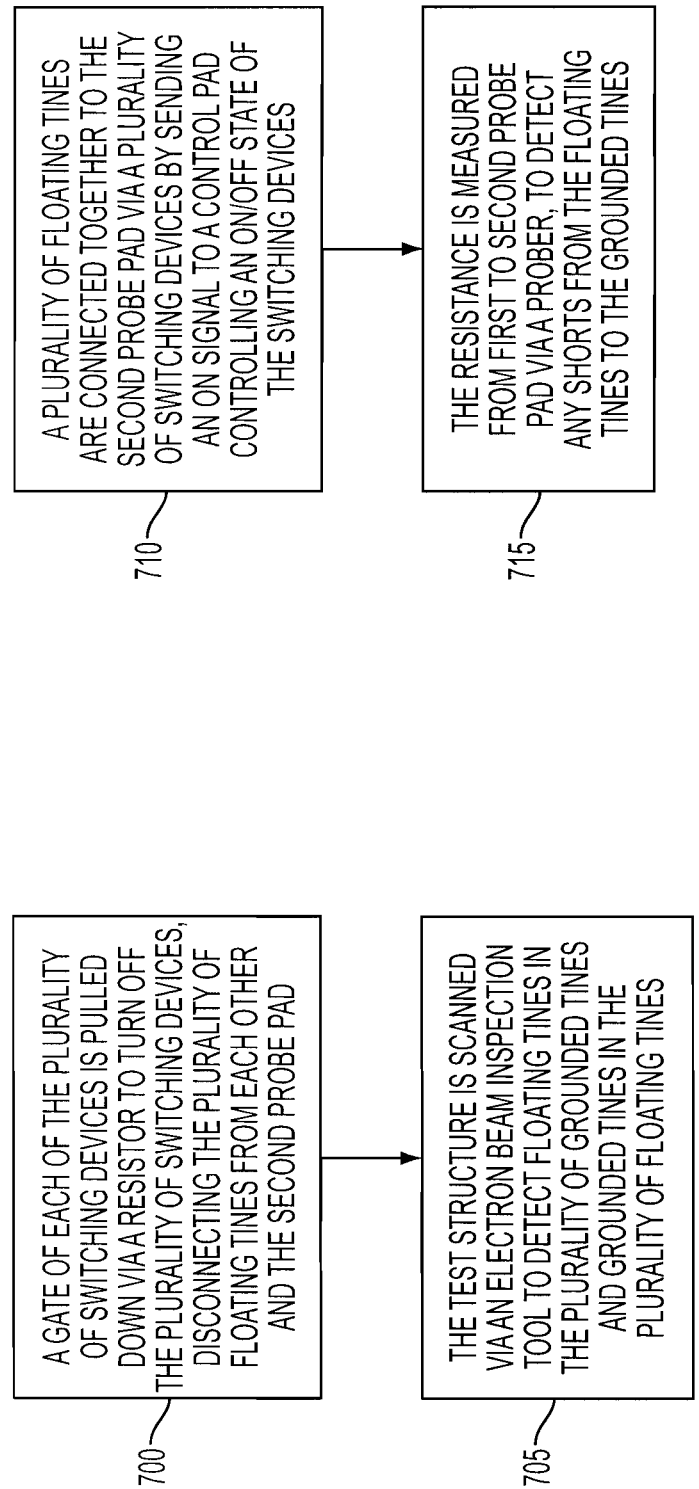

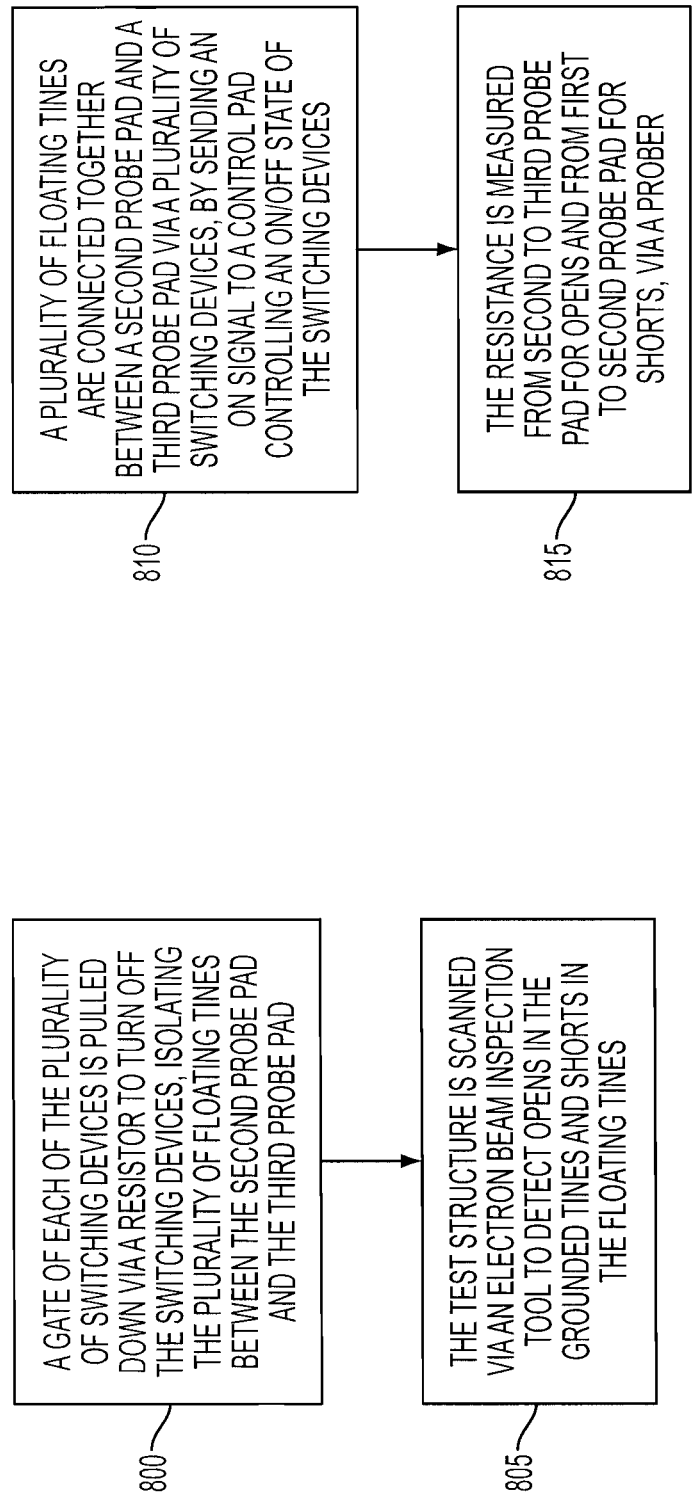

PROBE-ABLE VOLTAGE CONTRAST TEST STRUCTURES

CROSS-REFERENCE TO RELATED APPLICATION

This application is a divisional of U.S. patent application Ser. No. 12/539,732, filed Aug. 12, 2009, now U.S. Pat. No. 8,350,583, the disclosure of which is incorporated by reference herein in its entirety.

BACKGROUND

This invention relates to test structures for semiconductor fabrication, and more particularly to probe-able voltage contrast test structures for electrical testing and voltage contrast inspection, and a method for detecting defects using the same.

Mask area (space on the reticle) is a precious resource used during technology development and manufacturing of integrated circuits. Mask sets may cost 1 million dollars or more. During process development a wide range of test structures for characterizing the yield and functionality of different circuit components must incorporated on each mask set. In addition, design IP must also be included to test out the building blocks for ICs that will be manufacturing for sale. During manufacturing, primarily chips that will be sold consume the entire mask area. Generally there is not enough room on a mask set to accommodate all the test structures and other designs that could provide value Two classes of test structures often included on mask sets are probe-able test structures (e.g., combs and serpentine patterns) which are used to test for shorts and opens using electrical probes, and voltage contrast test structures which are used in line with a scanning electron microscope (SEM). The voltage contrast test structures provide feedback on defectivity at a level shortly after defect formation. The exact location of each defect is also isolated using this technique. Probe-able test structures are important because they enable a very large area to be tested quickly. Voltage contrast inspection is time consuming and so many wafers go without inspection. A greater number of wafers can be probed. Also using electrical probes, the exact resistance can be measured.

Probe-able test structures and voltage contrast test structures are different in structure. Probe-able test structures require large probe pads, which are connect to two or more electrical nodes in the structure. FIGS. 1A and 1B are diagrams illustrating conventional probe-able comb and serpentine structures, respectively. As shown in FIG. 1A, a conventional probe-able comb test structure 100 is provided. The conventional probe-able comb test structure 100 includes a plurality of probe pads 101 and 102 respectively connected to comb-like structures 103 and 104. In FIG. 1B, a conventional probe-able serpentine test structure 110 is provided. The conventional probe-able serpentine test structure 110, includes a plurality of probe pads 111 and 112 and a single meandering metal or wire 113 connected therebetween.

On the other hand, a voltage contrast test structure requires smaller electrical nodes for efficient defect isolation. FIG. 2 illustrates a conventional voltage contrast test structure 200. The conventional voltage contrast test structure 200 includes a grounded comb 201 including a plurality of grounded tines 202, and a plurality of floating tines 203 where each floating tine 203 is in between each grounded tine 202. These floating tines 203 are independent to allow defect isolation. To test for a short, end portions of the floating tines 203 are scanned in a scan area 204 and if there is a bridge from any one of the floating tines 203 to any of the grounded tines 202, the respective floating tine 203 becomes grounded.

The masking area has a limited amount of space. The probe-able test structures and the voltage contrast test structure typically are allocated in separate areas since they are designed differently. Therefore, a large amount of space within the masking area is used to accommodate these test structures.

SUMMARY

Embodiments of the present invention provide probe-able voltage contrast comb and serpentine test structures which save space within the masking area. These test structures may be inspected for defects using voltage contrast inspection where the exact defect location may be isolated and/or they may be electrically probed. In addition to the saving space, the data from these techniques can be compared to ensure each technique is performing accurately and to more thoroughly characterize the defectivity.

According to an embodiment of the present invention, a test structure for detecting defects within integrated circuits is provided. The test structure includes first, second and third probe pads, the first probe pad being connected to ground, a comb-like structure including a plurality of grounded tines connected to the first probe pad, and a plurality of floating tines, each floating tine provided in between the grounded tines. The test structure further includes a plurality of switching devices, each switching device coupled with an end portion of each floating tine, and connecting the floating tines to the second probe pad, and the third probe pad is a control pad connected to the plurality of switching devices, which controls on and off states of the switching devices during testing.

According to another embodiment of the present invention, a test structure for detecting defects within integrated circuits is provided. The test structure includes first, second, third and fourth probe pads, the first probe pad being connected to ground, a comb-like structure including a plurality of grounded tines and connected to the first probe pad, and a plurality of floating tines, each floating tine provided in between the grounded tines and each floating tine connected together between the second and third probe pads. The test structure further includes a plurality of switching devices, each switching device connected to an end portion of each floating tine and connecting the floating tines to the second and third probe pads, and the fourth probe pad is a control pad connected to the plurality of switching devices, which controls on and off states of the switching devices during testing.

According to another embodiment of the present invention, a method of detecting shorts using a test structure having first and second probe pads and a plurality of grounded tines connected with the first probe pad. The method includes pulling a gate of each of the plurality of switching devices down via a resistor, to turn off the plurality of the switching devices, disconnecting the plurality of floating tines from each other and the second probe pad. The method further includes scanning the test structure via an electron beam inspection tool to detect floating tines in the plurality of grounded tines, and grounded tines in the plurality of floating tines.

According to yet another embodiment of the present invention, a method of detecting opens and shorts using a test structure having first, second and third probe pads and a plurality of grounded tines connected with the first probe pad is provided. The method includes pulling a gate of each of the plurality of switching devices down via a resistor to turn off the switching devices, isolating the plurality of floating tines between the second probe pad and the third probe pad. The method further includes scanning the test structure via an electron inspection tool and detecting opens in the grounded tines and shorts in the floating tines.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 7A and 7B are flowcharts respectively illustrating a method for detecting shorts using the probe-able VC comb test structure shown in FIG. 3 during in-line testing via an inspection scanning electron microscope (SEM) and end of line testing via a prober, in accordance with an embodiment of the present invention.

FIGS. 8A and 8B are flowcharts respectively illustrating a method for detecting opens and shorts using the VC serpentine test structure shown in FIG. 6 during in-line test via an inspection SEM and end of line testing via a prober, in accordance with an embodiment of the present invention.

The detailed description explains the preferred embodiments of the invention, together with advantages and features, by way of example with reference to the drawings.

DETAILED DESCRIPTION

Figure 1A:
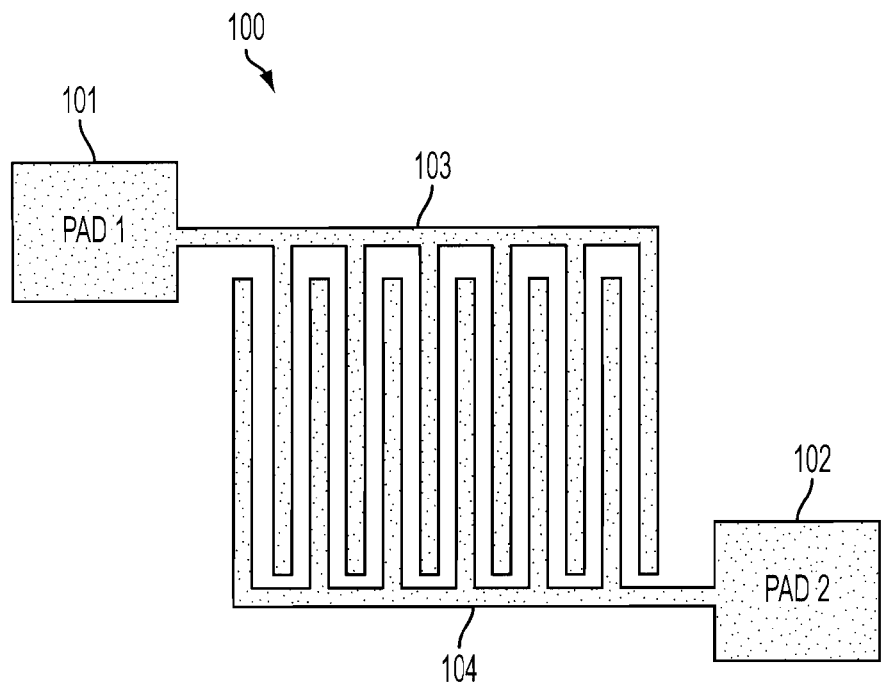
FIGS. 1A and 1B are diagrams illustrating conventional probe-able comb and serpentine test structures, respectively.
Figure 1B:
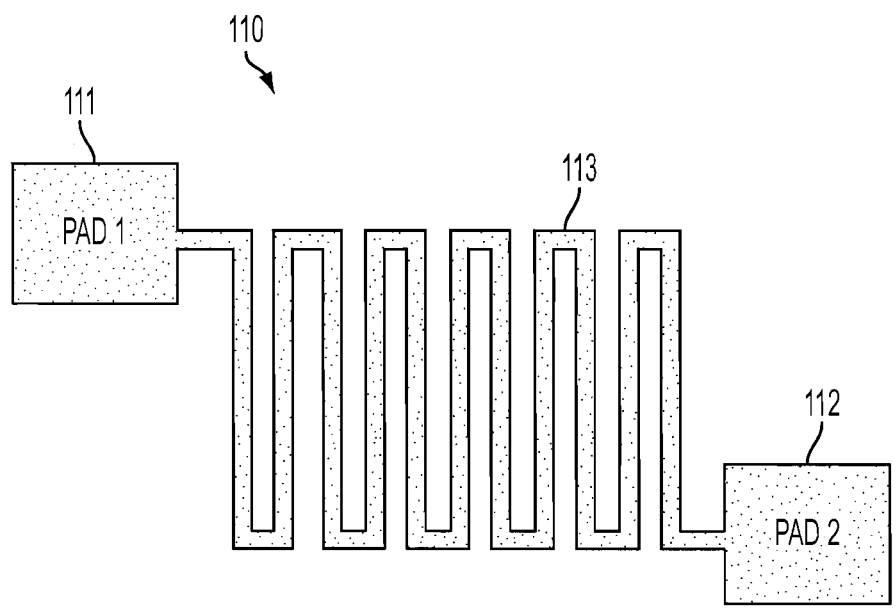
Figure 2:
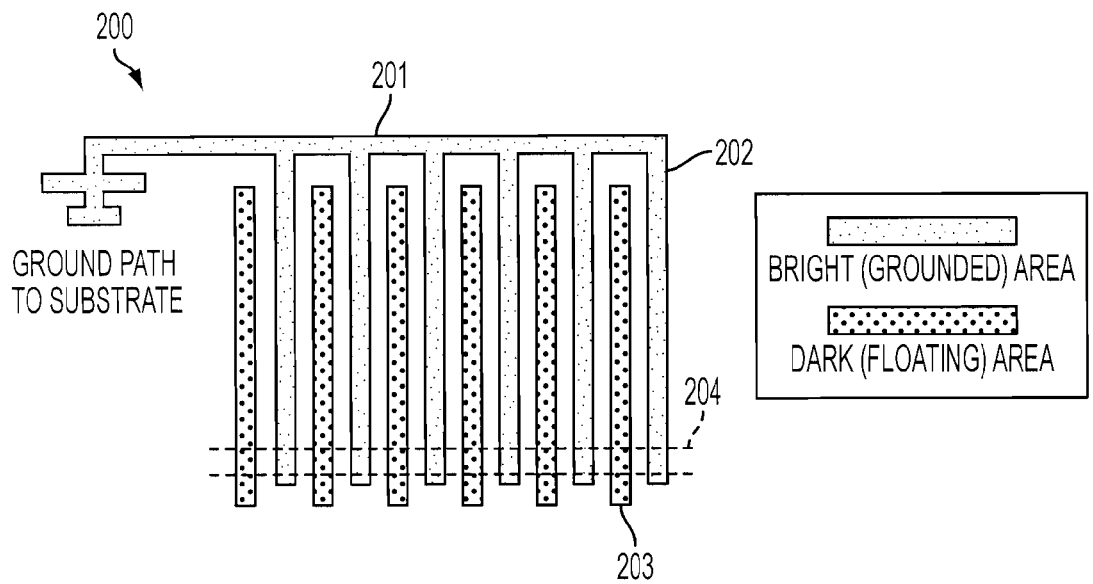
FIG. 2 is a diagram illustrating a conventional voltage contrast (VC) comb test structure.
Figure 3:
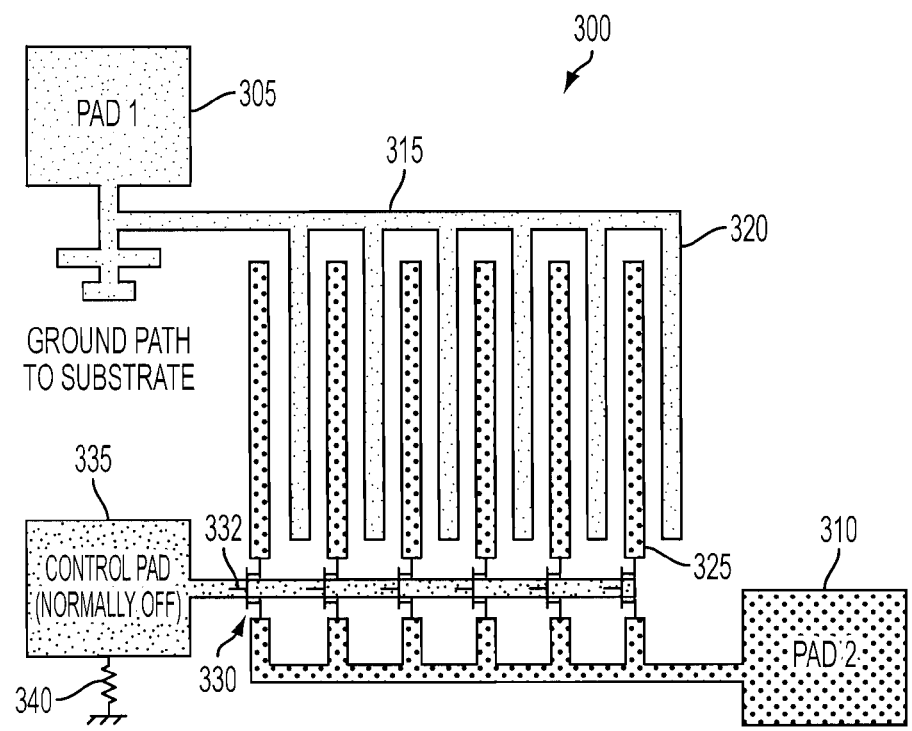
FIG. 3 is a diagram illustrating a probe-able VC comb test structure that can be implemented within embodiments of the present invention.

Turning now to the drawings in greater detail, it will be seen that in FIG. 3, there is a probe-able VC comb test structure according to an embodiment of the present invention. As shown in FIG. 3, a probe-able VC comb test structure 300 includes a plurality of probe pads (i.e., first and second probe pads 305 and 310), wherein the first probe pad 305 is connected to ground. The test structure 300 further includes a comb-like structure (i.e., a grounded comb 315) which includes a plurality of grounded tines 320. The test structure 300 further includes a plurality of floating tines 325. Each floating tine 325 is provided in between each grounded tine 320 for detection of shorts (as depicted in FIG. 4, for example).

According to an embodiment of the present invention, the test structure 300 further includes a plurality of active switching devices 330 corresponding to each of the plurality of floating tines 325. Each switching device 330 is coupled with an end portion of each floating tine 325. The switching devices 330 connect the plurality of floating tines 325 to the probe pad 310, for selectively connecting the floating tines 325 together. According to an embodiment of the present invention, the switching devices 330 may each include an n-type field effect transistor (nFET). That is, each floating tine 325 is connected to a respective switching device 330 which is in turn connected to probe pad 310 such that all of the floating tines 325 are connected together and to probe pad 310. According to an embodiment of the present invention, the width of each of the floating tines 325 is substantially similar to one another.

According to an embodiment of the present invention, the probe-able voltage contrast test structure 300 further includes a third probe pad (i.e., a control pad 335) coupled to the switching devices 330. The control pad 335 controls an on/off state of the switching devices 330. The probe-able voltage contrast test structure 300 further includes a resistor 340 wherein the control pad 335 is connected through the resistor 340 to ground. Each gate 332 of the switching devices 330 are connected to the control pad 335 and in turn connected to ground via the resistor 340. According to the current embodiment, the switching devices 330 are forced off by the resistor 340 during voltage contrast inspection because the control pad 335 is connected through the resistor 340 to ground. Therefore, each floating tine 325 is isolated. A charge is induced on the floating tines 325 to detect any shorts. The switching devices 330 are used to transform the floating tines 325 (i.e., electrical nodes) of the VC comb test structure 300 or other test structure into a single electrical node which is connected to the probe pad 310. An example of the detection of a short will now be discussed below with reference to FIG. 4.

Figure 4:
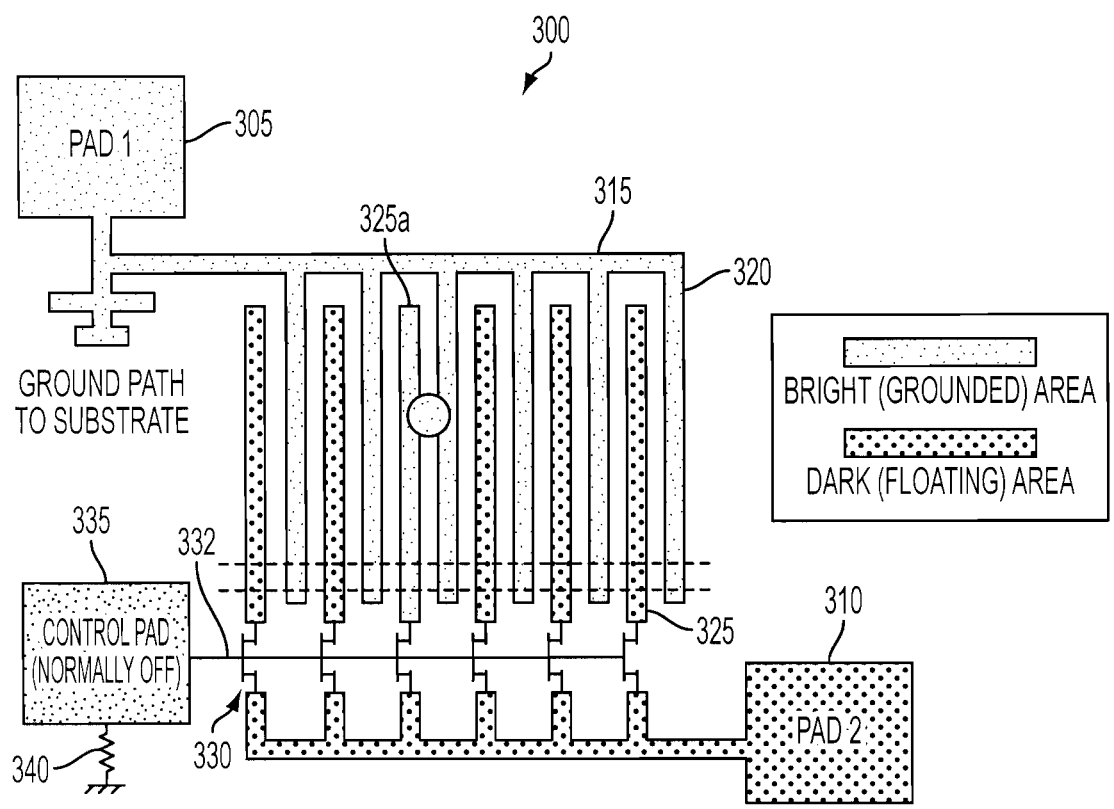
FIG. 4 is a diagram illustrating an example of the probe-able VC comb test structure shown in FIG. 3, having a short detected in-line with a voltage contrast inspection that can be implemented within embodiments of the present invention.

FIG. 4 is an example of the probe-able VC comb test structure 300 shown in FIG. 3, having a short during voltage contrast inspection. As shown in FIG. 4, during the voltage contrast inspection, the control pad 335 controls the switching devices 330 to be in an off state. That is, the gates 332 of the switching devices 330 are pulled to ground through the resistor 340 so that the switching devices 330 are off during voltage contrast inspection. Therefore, each floating tine 325 is isolated. According to another embodiment of the present invention, to ensure that the switching devices 330 stay off during inspection, the gate 332 of each switching device 330 may be tied to ground or a virtual ground through a resistor.

During the in-line VC inspection, the test structure 300 is scanned with a scanning electron microscope (SEM) and the SEM induces a charge on all the electrically floating tines 325 while the grounded tines 320 remain in a grounded state. Further, as shown, when a short 350 exists between a respective floating tine e.g., a floating tine 325a, for example, and a grounded tine 320 adjacent to the respective tine 325a, the respective tine 325a becomes grounded and turns bright. The grounded tines 320 emit more electrons than the floating tines 325 under electron extraction conditions thereby causing them to appear brighter than the floating tines 325. The other floating tines 325 remain dark.

Figure 5:
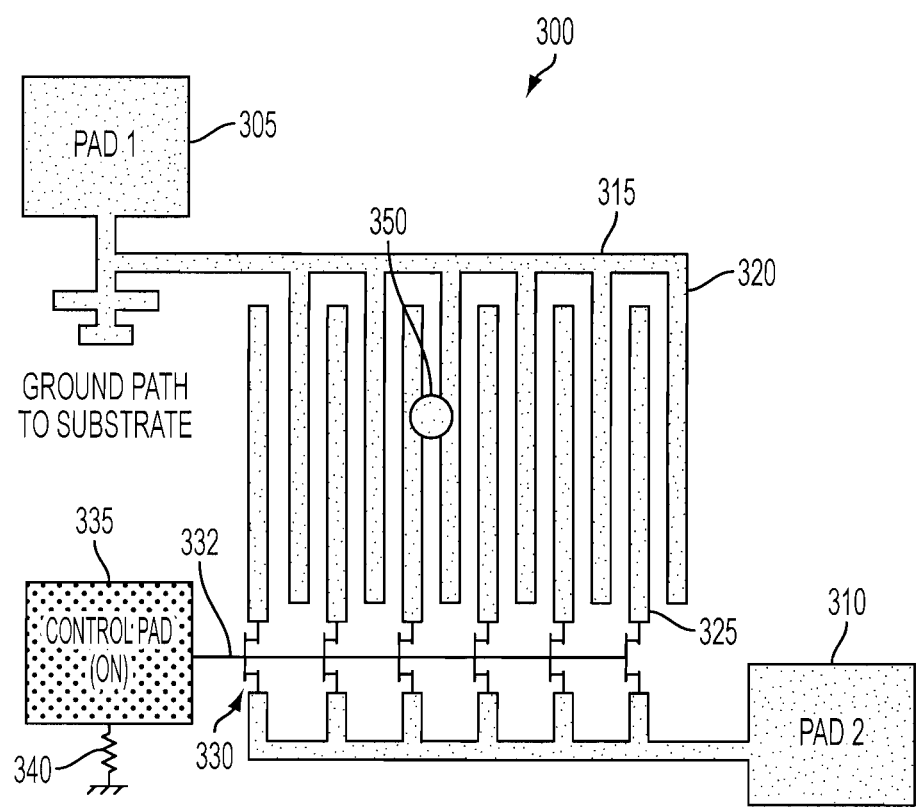
FIG. 5 is a diagram illustrating an example of the probe-able VC comb test structure shown in FIG. 3, during an electrical test operation that can be implemented within alternative embodiments of the present invention.

FIG. 5 is an example of the probe-able VC comb test structure 300 shown in FIG. 3, during an electrical test operation. During probing, the switching devices 330 are turned on by pulling the control pad 335 'high' and all of the floating tines 325 which are normally isolated are shorted together and connected to the probe pad 310 whereas the grounded tines 320 are connected to the probe pad 305. According to this embodiment, probe pad 310 is checking for shorts and when a short 350 exists, all of the tines 325 become grounded. During probing, the control pad 335 connected to the gates 332 of all the switching devices 330 is biased to a positive voltage greater than a threshold voltage, which may be approximately 0.15 volts (V). The control pad 335 is on therefore turning the switching devices 330 on during probing. All the normally floating tines 325 are then shorted into "one large bottom comb". The same short defect now causes the entire bottom comb to be shorted to the grounded comb 315 (as shown in FIG. 5, for example).

Figure 6:
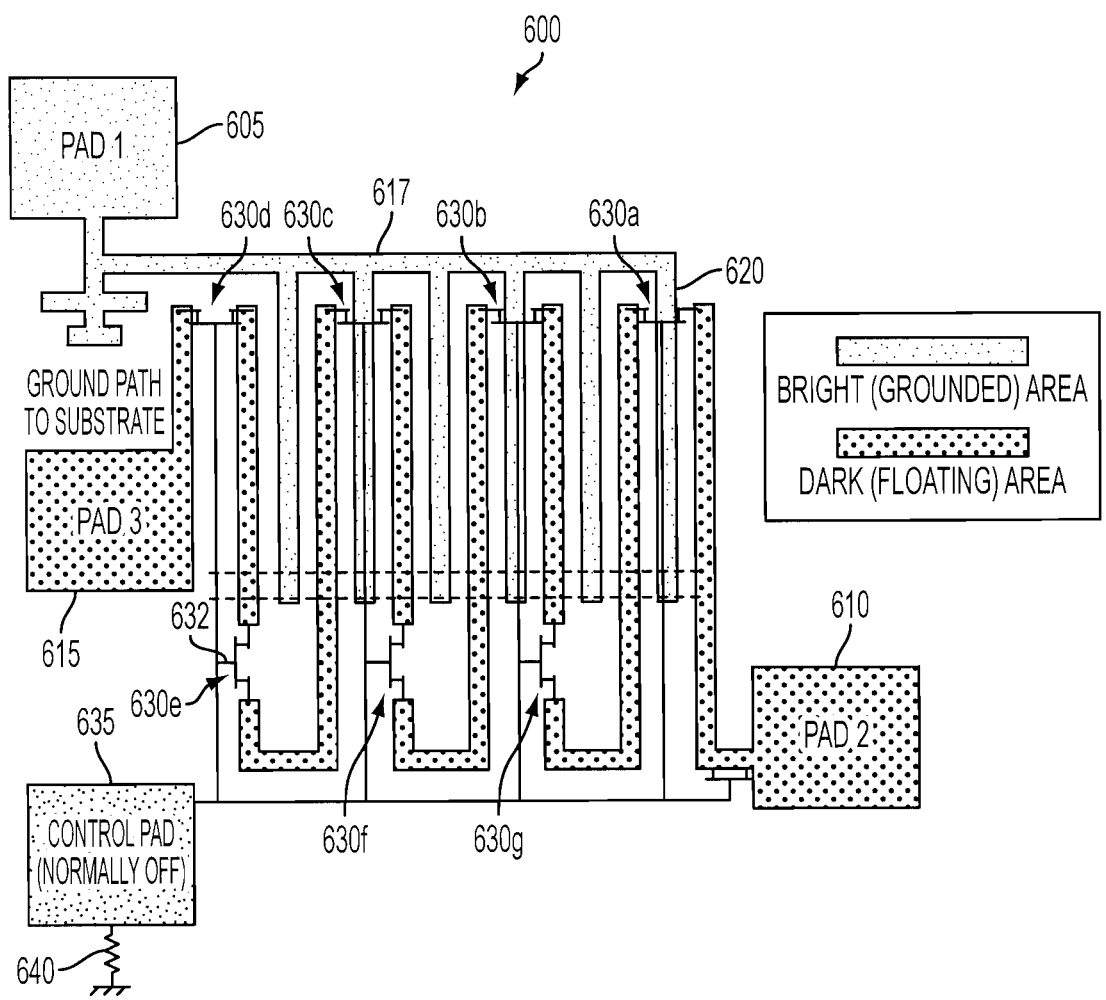
FIG. 6 is a diagram illustrating a probe-able VC serpentine test structure that can be implemented within embodiments of the present invention.

FIG. 6 is a diagram illustrating a probe-able voltage contrast serpentine test structure 600 which tests for opens which may occur due to missing conductive material defects. The test structure 600 includes a plurality of probe pads (i.e., first, second and third probe pads) 605, 610, and 615. The first probe pad 605 is connected to ground. The test structure 600 further includes a grounded comb 617 including a plurality of grounded tines 620 which are connected to the first probe pad 605. The test structure 600 further includes a plurality of floating tines 625. Each floating tine 625 is provided in between each grounded tine 620 and each floating tine 620 may be connected together between the second and third probe pads 610 and 615.

According to an embodiment of the present invention, the test structure 600 further includes a plurality of switching devices 630. Each switching device 630 is connected to an end portion of each floating tine 625 and connects the floating tines 625 to the second and third probe pads 610 and 615. According to an embodiment of the present invention, some of the switching devices 630 (i.e., switching devices 630a, 630b, 630c and 630d) are connected to one end portion of respective floating tines 625 and the remaining switching devices 630 (i.e., switching devices 630e, 630f and 630g) are connected to opposite end portions of respective floating tines 625. According to an embodiment of the present invention, the switching devices 630 may be nFETs.

The probe-able voltage contrast serpentine test structure 600 further includes a fourth probe pad (i.e., a control pad 635) connected to the plurality of switching devices 630, which controls on and off states of the switching devices 630. According to an embodiment of the present invention, gates 632 of the switching devices 630 are all connected to the control pad 635. During voltage contrast inspection, the switching devices 630 are in an off state and connected to ground through a resistor 640 connected to the control pad 635, and opens are detected in the grounded tines 620 of the grounded comb 617. During probing, the switching devices 630 are switched to an on state by the control pad 635 and opens are detected in the floating tines 625 from the probe pad 610 to the probe pad 615 by measuring the resistance from the probe pad 610 to the probe pad 615.

FIGS. 7A and 7B are flowcharts respectively illustrating a method for detecting shorts using the test structure shown in FIG. 3 during in-line testing via an inspection SEM and end of line testing via prober.

In FIG. 7A, in-line testing is performed via an inspection SEM. In this figure, the method is performed using a test structure having first and second probe pads and a plurality of grounded tines connected with the first probe pad. At operation 700, a gate of each of the plurality of switching devices is pulled down via a resistor to turn off the plurality of switching devices, disconnecting the plurality of floating tines from each other and the second probe pad. From operation 700, the process moves to operation 705 where the test structure is scanned via an electron beam inspection tool to detect floating tines in the plurality of grounded tines and grounded tines in the plurality of floating tines.

In FIG. 7B, end of line testing is performed via a prober. According to an embodiment of the present invention, at operation 710, a control pad is forced to a positive voltage greater than a threshold voltage to turn on the switching devices during probing, and to connect the isolated floating tines together and to the second probe pad. From operation 710, the process moves to operation 715, where a resistance is measured between the first and second probe pads to detect any shorts from the floating tines to the grounded tines via a prober.

According to an embodiment of the present invention, the threshold voltage is approximately 0.15 volts (V).

FIGS. 8B and 8B are flowcharts respectively illustrating a method for detecting opens and shorts using the test structure shown in FIG. 6 during in-line testing via an inspection SEM and end of line testing via a prober.

In FIG. 8A, in-line testing is performed via an inspection SEM. In this figure, the method is performed using a test structure having first, second and third probe pads and a plurality of grounded tines connected with the first probe pad. At operation 800, a gate of each of the plurality of switching devices is pulled down via a resistor to turn off the switching devices, isolating the plurality of floating tines between the second probe pad and the third probe pad. From operation 800, the process moves to operation 805 where the test structure is scanned via an electron beam inspection tool to detect opens in the grounded tines and shorts in the floating tines.

In FIG. 8B, end of line testing is performed via a prober. According to an embodiment of the present invention, at operation 810, a control pad is forced to a positive voltage greater than a threshold voltage to turn on the switching devices during probing, and to connect the floating tines together and to the second and third probe pads. From operation 810, the process moves to operation 815, where a resistance between the second and third probe pads is measured to detect opens in the floating tines and a resistance between the first and second probe pads is measured to detect shorts from the floating tines to the grounded tines via a prober.

According to an embodiment of the present invention, the same area is used for testing shorts and opens. Thus, the present invention provides the advantage of saving masking space. Further, the data generated from both these techniques may be compared to ensure that each technique is performing properly.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A test structure comprising:
   first, second, third and fourth probe pads, the first probe pad being connected to ground;
   a comb-like structure including a plurality of grounded tines and connected to the first probe pad;
   a plurality of floating tines, each floating tine provided in between the grounded tines and each floating tine connected together between the second and third probe pads;
   a plurality of switching devices, each switching device connected to an end portion of each floating tine and connecting the floating tines to the second and third probe pads, such that each floating tine is connected to switching device at both ends thereof, so as to form a serpentine-like structure of serially connected floating tines between the second and third probe pads; and the fourth probe pad being a control pad connected to the plurality of switching devices, which controls on and off states of the switching devices during testing.

2. The test structure of claim 1, further comprising a resistor wherein the control pad is connected through the resistor to ground.

3. The test structure of claim 2, wherein the switching devices are n-type field effect transistors.

4. The test structure of claim 3, wherein gates of the plurality of switching devices are connected to the control pad.

5. The test structure of claim 4, wherein during voltage contrast inspection, the switching devices are in an off state, and the test structure tests for opens in the grounded tines.

6. The test structure of claim 5, wherein during probing, the switching devices are switched to an on state by the control pad and the test structure tests for opens in the floating tines between the second probe pad and the third probe pad.

* * * * *